United States Patent [19]

Hirata

[11] Patent Number: 4,954,781
[45] Date of Patent: Sep. 4, 1990

[54] NUCLEAR MAGNETIC RESONANCE IMAGING APPARATUS WITH REDUCED ACOUSTIC NOISE

[75] Inventor: Haruhiko Hirata, Yokohama, Japan

[73] Assignee: Kabushiki Kaisha Toshiba, Kawasaki, Japan

[21] Appl. No.: 362,950

[22] Filed: Jun. 8, 1989

[30] Foreign Application Priority Data

Jun. 14, 1988 [JP] Japan .................................. 63-144887

[51] Int. Cl.$^5$ ............................................. G01R 33/20
[52] U.S. Cl. .................................... 324/318; 335/219; 324/300
[58] Field of Search ................ 335/216, 219; 324/300, 324/307, 309, 311–314, 318, 322, 319, 320, 372, 207.17, 262, 158 R; 128/653

[56] References Cited

U.S. PATENT DOCUMENTS

| | | | |
|---|---|---|---|
| 3,973,190 | 8/1976 | Ulyanov | 324/158 R |
| 3,980,947 | 9/1976 | Bielsten et al. | 324/262 |
| 4,719,362 | 1/1988 | Nest et al. | 324/207.17 |
| 4,755,944 | 7/1988 | Glass | 324/372 |

FOREIGN PATENT DOCUMENTS

| | | |
|---|---|---|
| 59-174746 | 10/1984 | Japan . |
| 59-216045 | 12/1984 | Japan . |
| 60-194340 | 10/1985 | Japan . |
| 61-82152 | 4/1986 | Japan . |
| 61-278741 | 12/1986 | Japan . |
| 61-279238 | 12/1986 | Japan . |

OTHER PUBLICATIONS

Yan et al., "Governing Equations for Vibrating Constrained-Layer Damping Sandwich Plates and Beams", Journal of Applied Mechanics, Dec. 1972, pp. 1041–1046.

*Primary Examiner*—Michael J. Tokar
*Attorney, Agent, or Firm*—Foley & Lardner, Schwartz, Jeffery, Schwaab, Mack, Blumenthal & Evans

[57] ABSTRACT

A nuclear magnetic resonance imaging apparatus capable of considerably reducing the disturbing acoustic noises originating from the vibration of the gradient coil. The apparatus includes a sandwich structure which is located between the body to be examined and the main magnet, comprising a viscoelastic layer sandwiched by a first and a second sandwiching members.

25 Claims, 19 Drawing Sheets

NUCLEAR MAGNETIC RESONANCE IMAGING APPARATUS WITH REDUCED ACOUSTIC NOISE

BACKGROUND OF THE INVENTION

1. Field of the Invention

The present invention relates to a nuclear magnetic resonance imaging apparatus for obtaining tomographic images of a body to be examined by utilizing a phenomenon of nuclear magnetic resonance.

2. Description of the Background Art

A nuclear magnetic resonance imaging apparatus provides an important means for analyzing atomic and electronic structures of matter or chemical compounds in a solid state and an organic chemistry research. Also, there are increasing uses in medical practice of the nuclear magnetic resonance imaging apparatus as a diagnostic device for obtaining tomographic images of arbitrary cross sections of a body to be examined, on a basis of such information as hydrogen distribution and spin relaxation times extracted by utilizing a nuclear magnetic resonance phenomenon.

A main portion of a conventional nuclear magnetic resonance imaging apparatus is shown in perspective view and in cross sectional view in FIGS. 1 and 2, respectively. As shown, there is a main magnet 1 with bore for generating a static magnetic field, a hollow cylindrical outer shell 2 inside the bore which is connected to the main magnet 1 by supporting member 3, and a hollow cylindrical inner shell 7 inside the outer shell 2 which is connected to the outer shell 2 by ring members 8. Between the outer shell 2 and the inner shell 7, there is a gradient coil 21 for producing gradient magnetic field which is connected to the outer shell 2 by means of first gradient coil supporting member 4, a second gradient coil supporting member 5 and a support rubber 6.

As shown in FIG. 3, the gradient coil 21 comprises a X-coil 25, a Y-coil 27, and a Z-coil 29 wound around a coil core 23, each of which produces the gradient field in X-, Y, and Z-directions, respectively. Also, as shown in FIG. 4, these X-coil 25, Y-coil 27, and Z-coil 29 are fixed on the coil core 23 by molding with a non-magnetic resin 24 with a relatively large Young'3 s modulus, such as epoxy resin.

Each of these X-coil 25, Y-coil 27, and Z-coil 29 is provided with a separate power source, so that pulsed current for producing the gradient field can be applied separately when taking measurements.

However, as such gradient coil 21 is used in a presence of a very large static magnetic field generated by the main magnet 1 (typically between 0.22 to 1.5 Tesla), a considerable amount of electromagneetic force is exerted on each of these X-coil 25, Y-coil 27, and Z-coil 29, which gives vibrations of the gradient coil 21, which in turn causes the large acoustic noise.

Although in the nuclear magnetic resonance imaging apparatus of FIG. 1 the gradient coil 21 is confined inside a space formed by the outer shell 2, the inner shell 7 and the ring members 8 so as to muffle such acoustic noise, there still is a significant amount of vibration of the outer shell 2 caused by the vibration of the gradient coil 21 mediated through the air and through the first gradient coil supporting member 4, the second gradient coil supporting member 5 and the support rubber 6, as well as through the ring members 8. The noises may also be produced by the vibration of the coil core 23 and the resin 24.

Such acoustic noises can be quite disturbing to a patient to be examined who will be placed in a measurement space inside the inner shell 7.

Thus, in a conventional nuclear magnetic resonance imaging apparatus it has not been possible to eliminate all the disturbing acoustic noises originating from the vibration of the gradient coil 21.

SUMMARY OF THE INVENTION

It is therefore an object of the present invention to provide a nuclear magnetic resonance imaging apparatus capable of considerably reducing the disturbing acoustic noises originating from the vibration of the gradient coil.

According to one aspect of the present invention there is provided a nuclear magnetic resonance imaging apparatus comprising: a main magnet for generating a static magnetic field in a measurement space in which a body to be examined is to be placed: gradient coil means for producing gradient magnetic fields over the static magnetic field: means for detecting signals from the body in the static and gradient magnetic fields due to a nuclear magnetic resonance phenomenon: means for processing the detected signals so as to obtain tomographic images of the body at arbitrary cross sections: and a sandwich structure which is located between the body an the main magnet, comprising a viscoelastic layer sandwiched by a first and a second sandwiching members.

According to another aspect of the present invention there is provided a nuclear magnetic resonance imaging apparatus, comprising: a main magnet for generating a static magnetic field in a measurement space in which a body to be examined is to be placed; gradient coil means for producing gradient magnetic fields over the static magnetic field; means for detecting signals from the body in the static and gradient magnetic fields due to a nuclear magnetic resonance phenomenon; means for processing the detected signals so as to obtain tomographic images of the body at arbitrary cross sections; and a hollow member which is located between the measurement space and the main magnet, including a viscoelastic layer.

According to another aspect of the present invention there is provided a nuclear magnetic resonance imaging apparatus, comprising: a main magnet for generating a static magnetic field in a measurement space in which a body to be examined is to be placed; gradient coil means for producing gradient magnetic fields over the static magnetic field, the gradient coil means being comprised of coils wound around a coil core, a first resin molding the coils, and a second resin having a larger stiffness than the first resin, the second resin surrounding the first resin, at least one of inside the second resin and between the first resin and second resin containing a viscoelastic layer; means for detecting signals from the body in the static and gradient magnetic fields due to a nuclear magnetic resonance phenomenon; and means for processing the detected signals so as to obtain tomographic images of the body at arbitrary cross sections.

According to another aspect of the present invention there is provided a nuclear magnetic resonance imaging apparatus, comprising: a main magnet for generating a static magnetic field in a measurement space in which a body to be examined is to be placed; gradient coil means for producing gradient magnetic fields over the static magnetic field, comprising a coil core which contains a viscoelastic layer, and coils wound around the coil core; means for detecting signals from the body in the static and gradient magnetic fields due to a nuclear magnetic resonance phenomenon; and means for processing the detected signals so as to obtain tomographic images of the body at arbitrary cross sections.

According to another aspect of the present invention there is provided a nuclear magnetic resonance imaging apparatus, comprising: a main magnet for generating a static magnetic field in a measurement space in which a body to be examined is to be placed; gradient coil means for producing gradient magnetic fields over the static magnetic field, comprising a coil core, coils wound around the coil core, and a resin molding the coils, at least one of inside the resin and between the coil core and resin containing a viscoelastic layer; means for detecting signals from the body in the static and gradient magnetic fields due to a nuclear magnetic resonance phenomenon; and means for processing the detected signals so as to obtain tomographic images of the body at arbitrary cross sections.

According to another aspect of the present invention there is provided a nuclear magnetic resonance imaging apparatus, comprising: a main magnet for generating a static magnetic field in a measurement space in which a body to be examined is to be placed; gradient coil means for producing gradient magnetic fields over the static magnetic field; means for detecting signals from the body in the static and gradient magnetic fields due to a nuclear magnetic resonance phenomenon; means for processing the detected signals so as to obtain tomographic images of the body at arbitrary cross sections; and a hollow member which supports the gradient coil means against the main magnet, and is located between the measurement space and the main magnet, including a viscoelastic layer.

Other features and advantages of the present invention will become apparent from the following description taken in conjunction with the accompanying drawings.

DETAILED DESCRIPTION OF THE PREFERRED EMBODIMENTS

Figure 1:
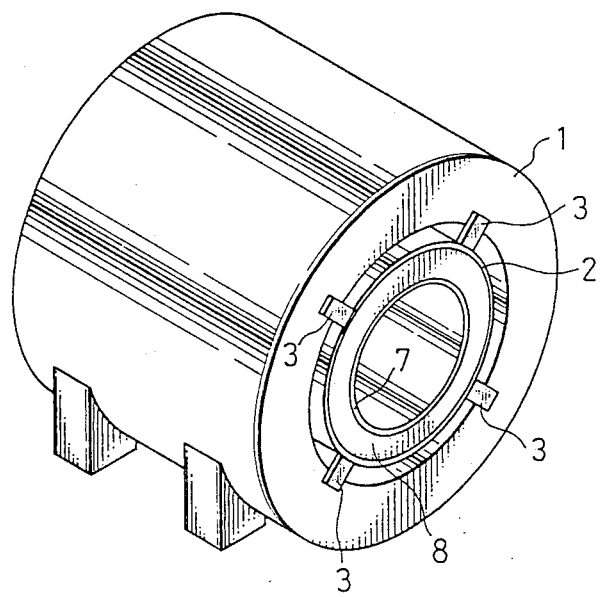
FIG. 1 is a perspective view of a main portion of a conventional nuclear magnetic resonance imaging apparatus.
Figure 2:
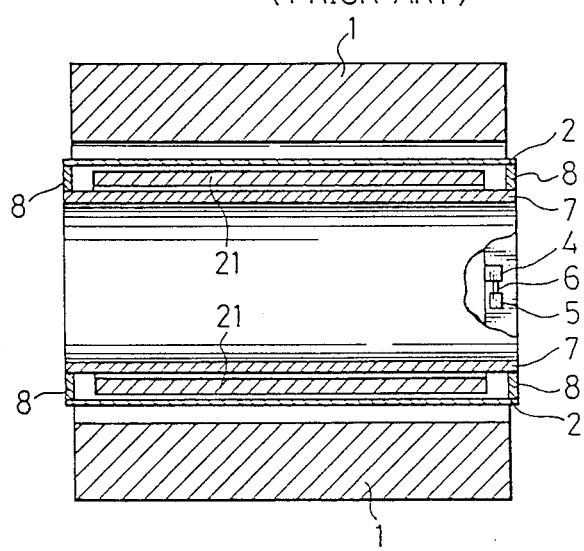
FIG. 2 is a cross sectional view of a main portion of the conventional nuclear magnetic resonance imaging apparatus of FIG. 1.
Figure 3:
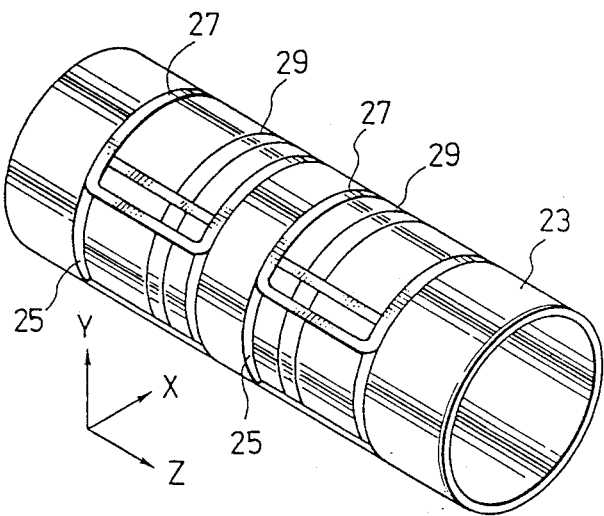
FIG. 3 is a perspective view of a gradient coil of the conventional nuclear magnetic resonance imaging apparatus of FIG. 1.
Figure 4:
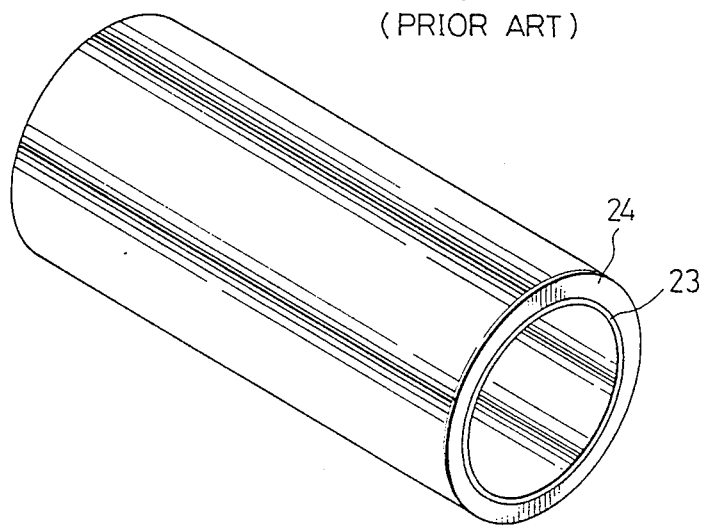
FIG. 4 is a perspective view of a coil core and a resin mold for the gradient coil of FIG. 3.

In the following description of the various preferred embodiments, those parts of a nuclear magnetic resonance imaging apparatus which are substantially equivalent to corresponding parts of the conventional nuclear magnetic resonance imaging apparatus of FIGS. 1 and 2 will be given the same labels in the figures, and their explanations which can be found in the description of the background art above will in general be omitted to avoid unnecessary repetition.

Figure 5:
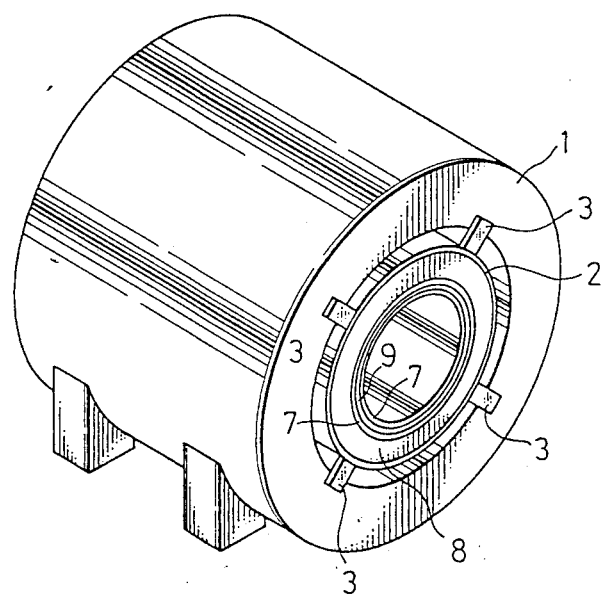
FIG. 5 is a perspective view of a main portion of the first embodiment of a nuclear magnetic resonance imaging apparatus according to the present invention.
Figure 6:
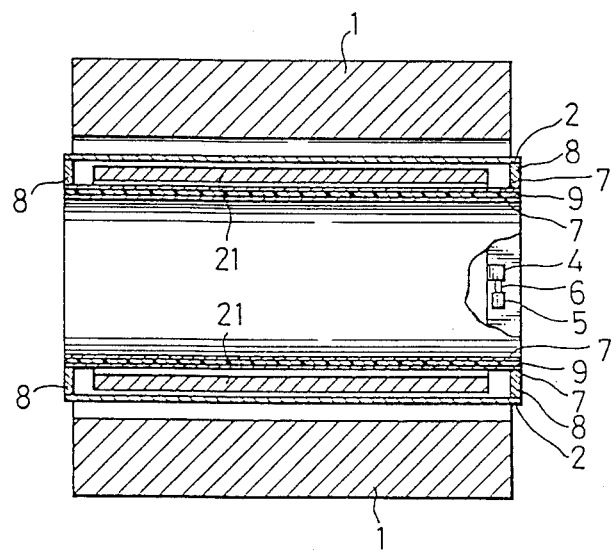
FIG. 6 is a cross sectional view of a main portion of the nuclear magnetic resonance imaging apparatus of FIG. 5.

Referring now to FIGS. 5 and 6, there is shown a first embodiment of a nuclear magnetic resonance imaging apparatus according to the present invention.

In this first embodiment, there is provided a viscoelastic layer 9 made of polymer compounds such as butyl rubber, silicon rubber, polysulfide rubber, urethane rubber, fluoro rubber, polyvinyl chloride acetate, Neoprene rubber(Trade Name), and VEM(Trade Name) between a gradient coil 21 and a body to be examined which will be placed in a measurement space inside the bore of an inner shell 7. Such a viscoelastic layer 9, for example, can be formed in a middle of the inner shell 7, as shown in FIGS. 5 and 6, by pouring liquid viscoelastic material into a hollow region prepared in the inner shell 7.

The insertion of this viscoelastic layer 9 for the purpose of reducing acoustic noises is based on the following analysis due to the present inventor, of the mechanism of generation and propagation of acoustic noises in a nuclear magnetic resonance imaging apparatus, which has been largely unknown heretofore.

Figure 7A:
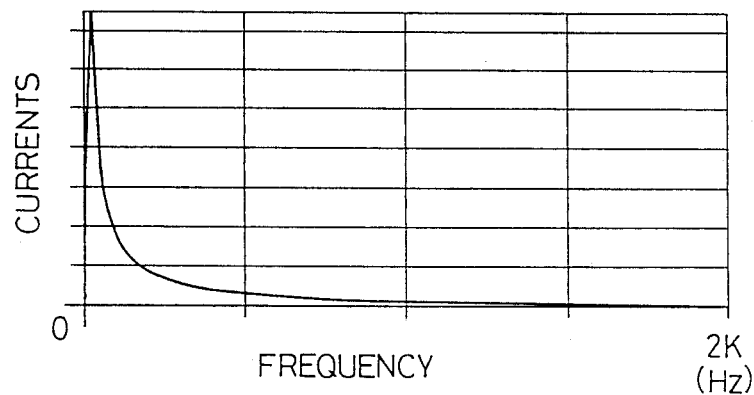
FIGS. 7(A) and 7(B) are a graph of frequency characteristic of currents in a gradient coil and a diagram of force due to the currents, respectively, for the nuclear magnetic resonance imaging apparatus of FIG. 5.
Figure 7B:
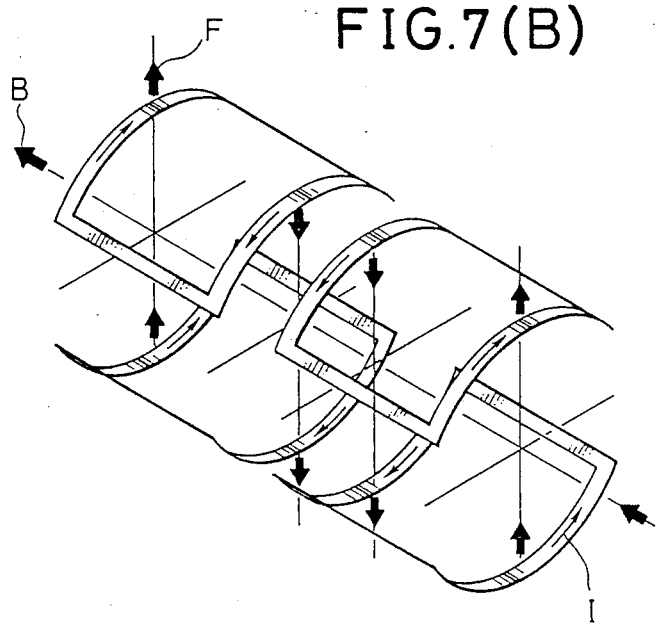
Figure 8A:
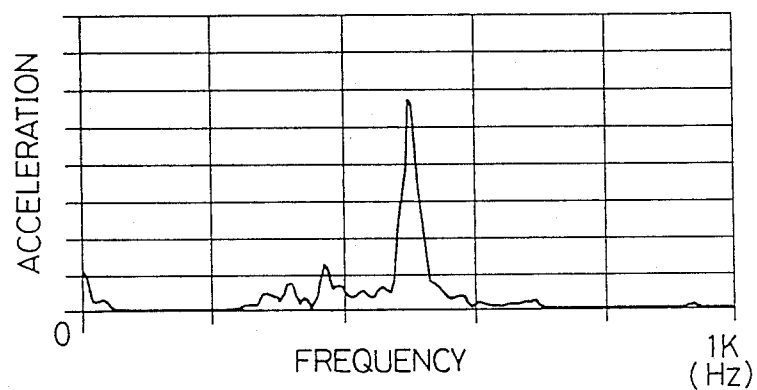
FIGS. 8(A) and 8(B) are a graph of frequency characteristic of vibrations in the gradient coil and a diagram of vibration modes of the gradient coil, respectively, for the nuclear magnetic resonance imaging apparatus of FIG. 5.
Figure 8B:
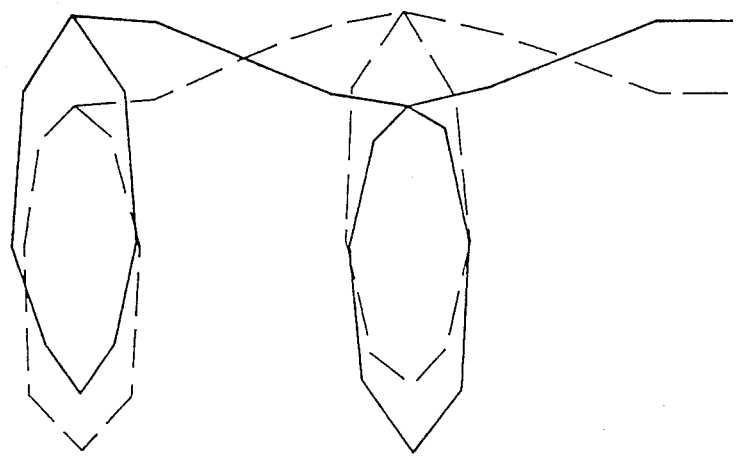
Figure 9A:
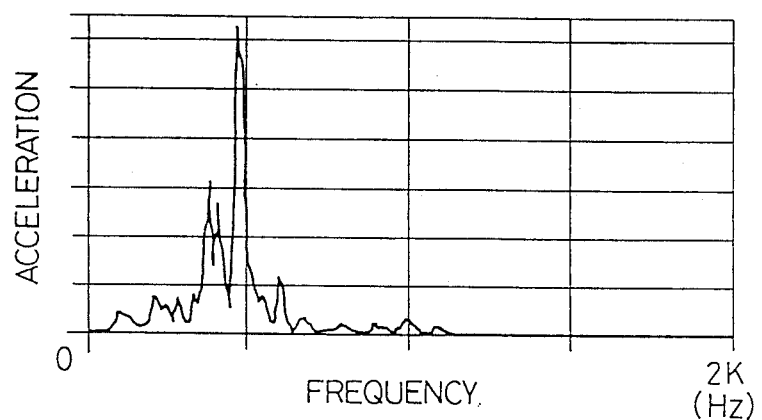
FIGS. 9(A) and 9(B) are a graph of frequency characteristic of vibrations in a transmitter and receiver coil and a diagram of vibration modes of the transmitter and receiver coil, respectively, for the nuclear magnetic resonance imaging apparatus of FIG. 5.
Figure 9B:
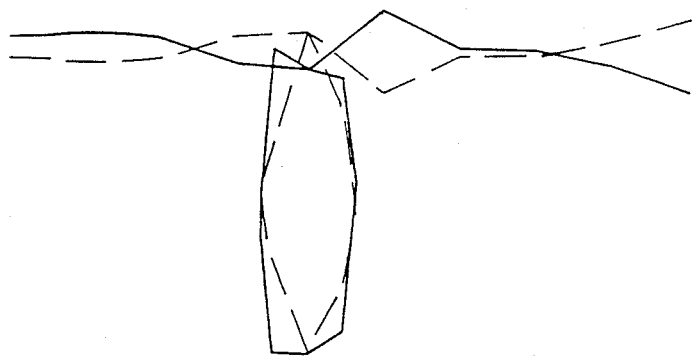
Figure 10A:
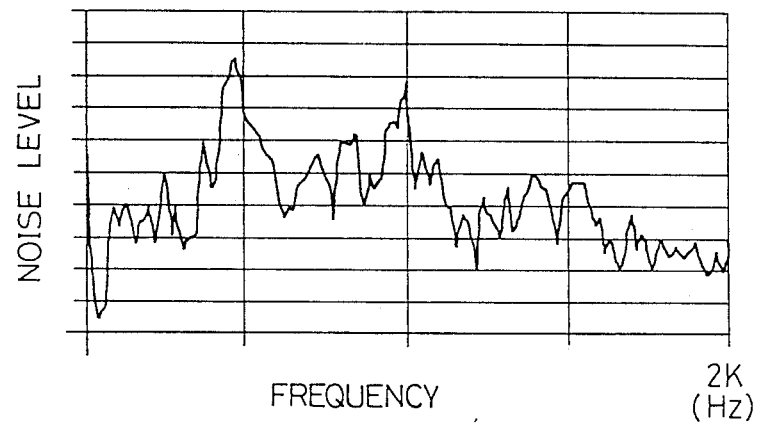
FIGS. 10(A) and 10(B) are graphs of frequency characteristic and positional variation of acoustic noises, respectively for the nuclear magnetic resonance imaging apparatus of FIG. 5.
Figure 10B:
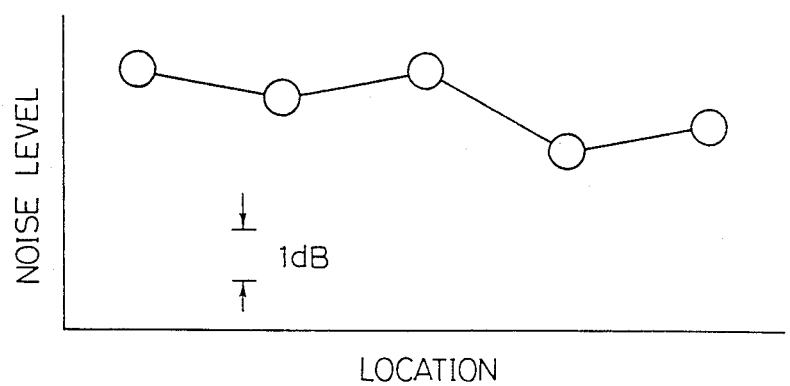

It has been found that the propagation of acoustic noises takes place by a route of <force due to currents in the gradient coil 21>→<vibration of the gradient coil 21>→<vibration of the inner shell 7>→<acoustic noises>. Relevant data has been complied which are shown in FIGS. 7 to 10, of which FIG. 7(A) shows a graph of frequency characteristic of currents in the gradient coil 21 and FIG. 7(B) shows a diagram of force F due to the currents I in the gradient coil 21 along with the direction of the static magnetic field B generated by the main magnet 1, while FIG. 8(A) show a graph of frequency characteristic of vibrations in the gradient coil 21 in terms of instantaneous acceleration and FIG. 8(B) shows a diagram of vibration modes of the gradient coil 21, i.e., extreme configurations of the gradient coil 21. Also, FIG. 9(A) shows a graph of frequency characteristics of vibrations in the inner shell 7 in terms of instantaneous acceleration and FIG. 9(B) shows a diagram of vibration modes of the inner shell 7, i.e. extreme configurations of the inner shell 7, while FIGS. 10(A) and 10(B) show graphs of frequency characteristic and positional variation of acoustic noises along a central axis of the measurement space, respectively.

As can be seen from FIGS. 7 to 10, the gradient coil 21 is fed with a pulsed current shown in FIG. 7(A) which shows increasingly small higher frequency components. Such currents in a presence of the static magnetic field B induces time varying forces F shown in FIG. 7(B) in the gradient coil 21, which causes an instantaneous simple bending deformation in the gradient coil 21, resulting in the vibration of the gradient coil 21. Here, as the currents I have no prominent component, the characteristic vibration mode shown in FIG. 8(B) which is the closest to the mode of induced forces F will arises and, as shown in FIG. 8(A), a characteristic frequency of about 500 Hz corresponding to this mode of vibration becomes dominant.

Such vibration of the gradient coil 21 causes the vibration of the inner shell 7 through the air between the gradient coil 21 and the inner shell 7. Here, the vibration frequency of the inner shell 7 is identical to that of the gradient coil 21 as shown in FIG. 9(A), but the vibration mode for the inner shell 7 is different from that of the gradient coil 21 as shown in FIG. 9(B), because the vibration is mediated by the air and also because the vibration of the inner shell 7 is associated with that of the outer shell 2 which supports it.

Such vibration of the inner shell 7 in turn gives rise to the acoustic noise inside the measurement space. As shown in FIG. 10(A), a major contribution to this acoustic noise comes from the characteristic frequency of the vibration of the inner shell 7, which is equal to the characteristic frequency of the vibration of the gradient coil 21 as mentioned above. It is further shown in FIG. 10(B) that the acoustic noise is not uniform along a central axis through the measurement space.

On the basis of this analysis, the insertion of the viscoelastic layer 9 in the inner shell 7 which lies between the gradient coil 21 and the measurement space, as in the first embodiment described above, will be effective in reducing the generation of the acoustic noises because this viscoelastic layer 9 functions to interrupt the route of the propagation of the acoustic noises.

In order to verify this, the following first experiment had been conducted by the present inventor.

Figure 11:
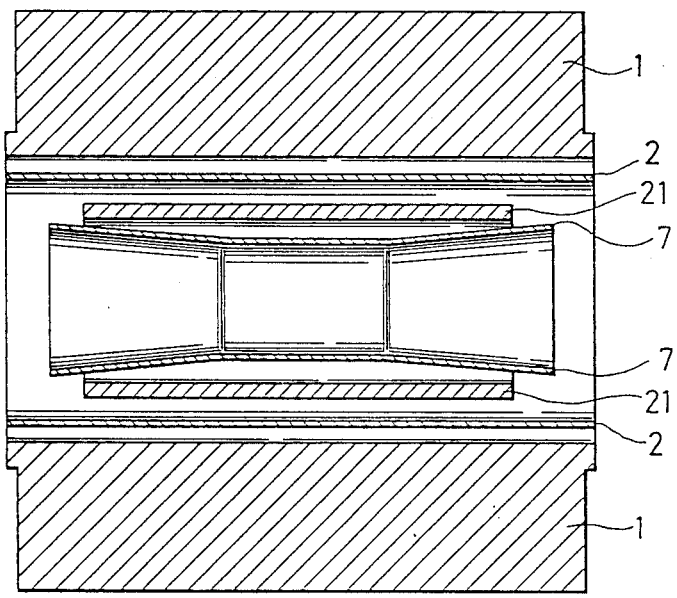
FIG. 11 is a cross sectional view of a main portion of a nuclear magnetic resonance imaging apparatus according to the first embodiment with which the experiments had been conducted.
Figure 12:
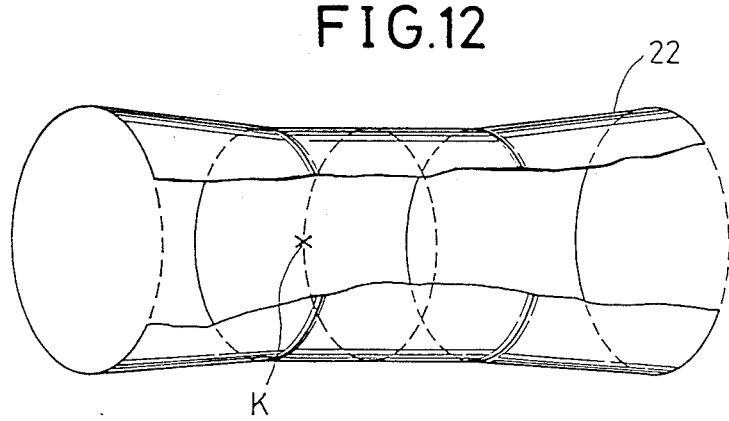
FIG. 12 is a diagrammatic illustration of an inner shell of the nuclear magnetic resonance imaging apparatus of FIG. 11 for explaining a position where the measurement of the acceleration had been taken in the first experiment.

FIG. 11 shows the actual configuration of a nuclear magnetic resonance imaging apparatus used in this first experiment. In this nuclear magnetic resonance imaging apparatus, the transmitter and receiver coil is wound around the inner shell 7. An acceleration pickup is attached on this transmitter and receiver coil at a middle in the direction of the central axis of the measurement space, as shown by a point K in FIG. 12. The frequency characteristics of the acoustic noises are measured with this acceleration pickup for both the nuclear magnetic resonance imaging apparatus of FIG. 11 (with the viscoelastic layer 9) and a conventional nuclear magnetic resonance imaging apparatus of similar type (without the viscoelastic layer 9).

Figure 13:
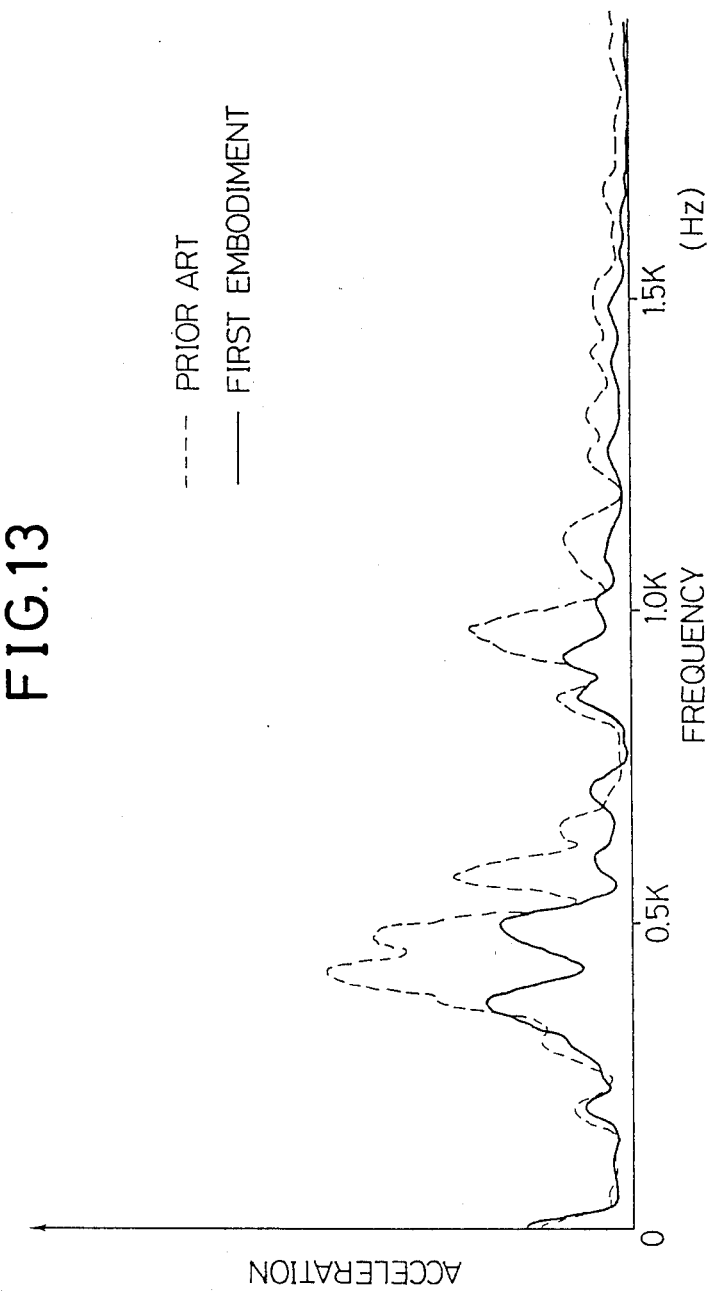
FIG. 13 is a graph of frequency characteristic of vibrations in an inner shell for both a conventional nuclear magnetic resonance imaging apparatus and the nuclear magnetic resonance imaging apparatus of FIG. 11, obtained by the first experiment.

The result of this experiment is shown in FIG. 13, where the frequency characteristic obtained by the nuclear magnetic resonance imaging apparatus of FIG. 11 (with the viscoelastic layer 9) which is represented by a solid curve is contrasted against that obtained by the conventional nuclear magnetic resonance imaging apparatus of similar type (without the viscoelastic layer 9) which is represented by a dashed curve. FIG. 13 clearly indicates that the vibration of the transmitter and receiver coil is the nuclear magnetic resonance imaging apparatus of FIG. 11 is substantially reduced over entire range of frequencies, and particularly around the characteristic frequency of 500 Hz compared with that in the conventional nuclear magnetic resonance apparatus.

Considering the direct relationship between the vibration of the transmitter and receiver coil and the acoustic noise, it can be concluded therefore that with the first embodiment of the present invention, the significant reduction of the acoustic noise inside the measurement space can be achieved.

The mechanism for this reduction of the acoustic noise by the inserted viscoelastic layer 9 has been analyzed by the present inventor as follows.

As already mentioned, in a configuration such as that of FIG. 11 in which the viscoelastic layer 9 is inserted in a middle of the inner shell 7, the electromagnetic forces will be exerted on each coil winding as the pulsed currents are fed in the presence of the static magnetic field. The resulting vibration of the gradient coil 21 will then be propagated through the air as well as through members supporting the gradient coil 21 to the inner shell 7, causing the bending vibration of the inner shell 7 which is a direct cause of the acoustic noise in the measurement space. In such a situation, it has been observed that the viscoelastic layer 9 is primarily subjected to shearing deformation.

Figure 14:
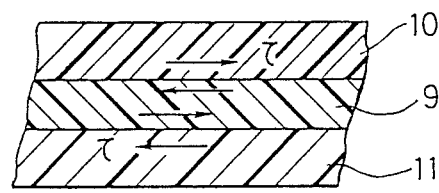
FIG. 14 is an illustration of a cross section of a sandwich structure around viscoelastic layer in the nuclear magnetic resonance imaging apparatus of FIG. 5, for explaining shearing deformation arising in the sandwich structure.

FIG. 14 depicts a simple shearing deformation on the viscoelastic layer 9 which is located between a first and second resin members 10 and 11 made of resin with relatively large Young's modulus such as epoxy resin. In FIG. 14, $\tau$ represents a shearing stress exerted on the viscoelastic layer 9.

Now, suppose the shearing stress $\tau$ causes the shear strain $\gamma$ in the viscoelastic layer 9, and let the shearing stress $\tau$ and the shear strain $\gamma$ be harmonic in time, then the shearing stress $\tau$ and the shear strain $\gamma$ can be expressed in terms of complex shearing stress $\tilde{\tau}$ and the complex shear strain $\tilde{\gamma}$ as:

$$\tau = Re\ [\tilde{\tau} \cdot e^{-j\omega t}] \qquad (1)$$

$$\gamma = Re\ [\tilde{\gamma} \cdot e^{-j\omega t}] \qquad (2)$$

where Re means a real part, j is an imaginary unit, $\omega$ is an angular frequency, and t is a time. Also, in general, the shear modulus G which characterizes elastic bodies is also expressed in a complex form as:

$$G = G_0(1 + j\beta) \qquad (3)$$

where the $G_0$ is a real shear modulus, and $\beta$ is a loss factor. In addition, the relationship:

$$\tilde{\tau} = G \cdot \tilde{\gamma} \qquad (4)$$

holds.

Meanwhile, the energy dissipation D dissipated by a unit volume of the viscoelastic layer 9 in one period of the vibration can be expressed as:

$$\begin{aligned} D &= \oint Im[\tilde{\tau} \cdot e^{-j\omega t}]\dot{\gamma}dt \\ &= \oint G_0\beta|\gamma|\sin(\omega t + \phi) \cdot |\gamma|\sin(\omega t + \phi)dt \\ &= \pi\omega G_0\beta|\gamma|^2 \end{aligned} \qquad (5)$$
$$\qquad (6)$$

where Im means an imaginary part, and $\phi$ is an initial phase of the shear strain $\gamma$. The equation (6) shows that the energy dissipation D is proportional to the loss factor $\beta$ and the square of the shear strain $\gamma$.

Moreover, for the situation of FIG. 14, the shear strain $\gamma$ can be expressed in terms of displacement u of the resin members 10 and 11 as:

$$\gamma = \partial u/\partial y \qquad (7)$$

where y is a coordinate along a direction of the thickness of the viscoelastic layer 9. When the displacement u is small enough to be expressed as $\delta u$, the relation:

$$\gamma = \delta u/\delta y \qquad (8)$$

holds.

Accordingly, it can be deduced from the equation (6), (7), and (8) that the energy dissipation D can be made large when the shear strain $\gamma$ of the viscoelastic layer 9 is made large by making the thickness of the viscoelastic layer 9 ($\gamma y$ in Eq. (8)) as thin as possible.

Figure 15:
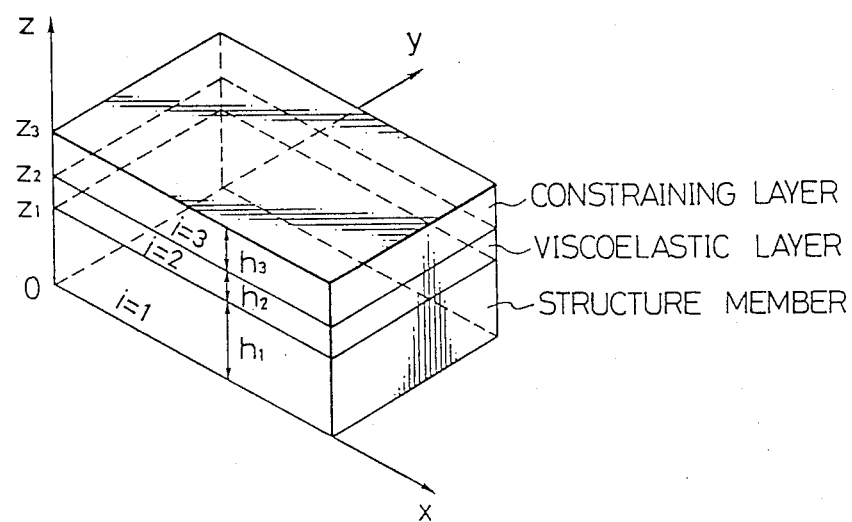
FIG. 15 is a perspective illustration of the sandwich structure of FIG. 14, for explaining the reduction of acoustic noise achieved by the sandwich structure.

As a more realistic model, a plate with sandwich structure comprising a constraining layer, viscoelastic layer and a structure member shown in FIG. 15 will now be considered. Such a model has been discussed by Yan and Dowell in Journal of Applied Mechanics, Dec. 1972, pp. 1041-1046, in which they gives the equation of motion for vibration of such a model as:

$$\tilde{\beta}\nabla^4 S + \rho(\tilde{\alpha}/G_0)\nabla^2\ddot{\tilde{s}} + \rho\ddot{\tilde{S}} = 0 \qquad (9)$$

where s is a transverse displacement function of plate, $\rho$ is a density, and:

$$\tilde{\beta} = (D_1 I_{10} + D_3 I_{30}) - \frac{(D_1 A_{10} + D_3 A_{30})^2}{D_1 h_1 + D_3 h_3} \qquad (10)$$

$$\tilde{\alpha} = \frac{D_1 D_3}{h_1 + h_2 + h_3} \frac{h_2(h_3 A_{10} - h_1 A_{30})}{D_1 h_1 + D_3 h_3} \qquad (11)$$

$$D_1 = \frac{E_1}{1 - \nu_1^2}, D_3 = \frac{E_3}{1 - \nu_3^2} \qquad (12)$$

$$A_{10} = \frac{Z_1^2}{2}, A_{30} = \frac{Z_3^2 - Z_2^2}{2} \qquad (13)$$

$$I_{10} = \frac{Z_1^3}{3}, I_{30} = \frac{Z_3^3 - Z_2^3}{3} \qquad (14)$$

where $E_1$ and $E_3$ are Young's modulus for the structure member and the constraining layer, respectively, $\nu_1$ and $\nu_3$ are Poisson ratio for the structure member and the constraining layer, respectively, $h_1$, $h_2$ and $h_3$ are thickness of the structure member, the viscoelastic layer and the constraining layer, respectively, and $Z_1$, $Z_2$ and $Z_3$ are Z-coordinate of the top of the structure member, the viscoelastic layer, and the constraining layer, respectively, with the bottom of the structure member having a Z-coordinate equal to 0. Also,:

$$\nabla^2 = \frac{\partial^2}{\partial x^2} + \frac{\partial^2}{\partial y^2} \qquad (15)$$

i.e., a harmonic operator, and a dot over a letter represents a time derivative.

Now, assuming the harmonic time dependence of the transverse displacement function of plate s, introducing a complex transverse displacement function of plate S as:

$$s = Re\ [S \cdot e^{-j\omega t}] \qquad (16)$$

where Re means a real part, j is an imaginary unit, $\omega$ is an angular frequency, and t is a time, and using the complex shear modulus given by the Eq.(3), the Eq.(9) becomes:

$$\beta \nabla^4 S + j\rho\omega^2 \frac{-\bar{a}}{G_0} \frac{\beta}{1+\beta^2} \nabla^2 S - \rho\omega^2 S = 0 \quad (17)$$

by regarding the conservation of the viscoelastic layer against shearing as negligible compared with the conservation of the structure member and the constraining layer against bending.

Then, from the Eq.(17), the energy dissipation D in one period of vibration can be obtained as:

$$D = \pi\rho\omega^2 \frac{-\bar{a}}{G_0} \frac{\beta}{1+\beta^2} \iint\{|S|(\nabla^2|S|)\}dxdy \quad (18)$$

and the maximum of the potential energy $E_{pmax}$ can be obtained as:

$$E_{pmax} = \bar{\beta} \iint\{=S=(\nabla^4=S=)\}dxdy \quad (19)$$

With these Eqs.(18) and (19), one can define a total loss factor $\eta$ of the plate with sandwich structure as:

$$\eta = \frac{D}{2\pi E_{pmax}} = \frac{\rho}{G_0} \frac{\beta}{1+\beta^2} \cdot \xi \cdot C_m \quad (20)$$

where $C_m$ is a part depending on the vibration frequency and the vibration mode of the plate, which is unimportant in what follows, and:

$$\xi = \frac{-\bar{a}}{2\bar{\beta}} \quad (21)$$

which is a dimensionless parameter. Now, using $r_1 = h_1/(h_1+h_2+h_3)$ and $r_2 = h_2/(h_1+h_2+h_3)$ and assuming that $h_2$ is sufficiently thinner than $h_1+h_2+h_3$ such that $0.25 >> r_2$, the dimensionless parameter $\xi$ can be expressed as:

$$\xi = \frac{3r_2(r_1 - r_1^2)}{[R_D + (1/R_D) - 2]r_1^4 + 4(1 - R_D)r_1^3 - 6(1 - R_D)r_1^2 + 4(1 - R_D)r_1 + R_D} \quad (22)$$

where:

$$R_D = \frac{E_3(1 - \nu_1^2)}{E_1(1 - \nu_3^2)} \quad (23)$$

which is a ratio of stiffness of the constraining layer and the structure member.

Figure 16:
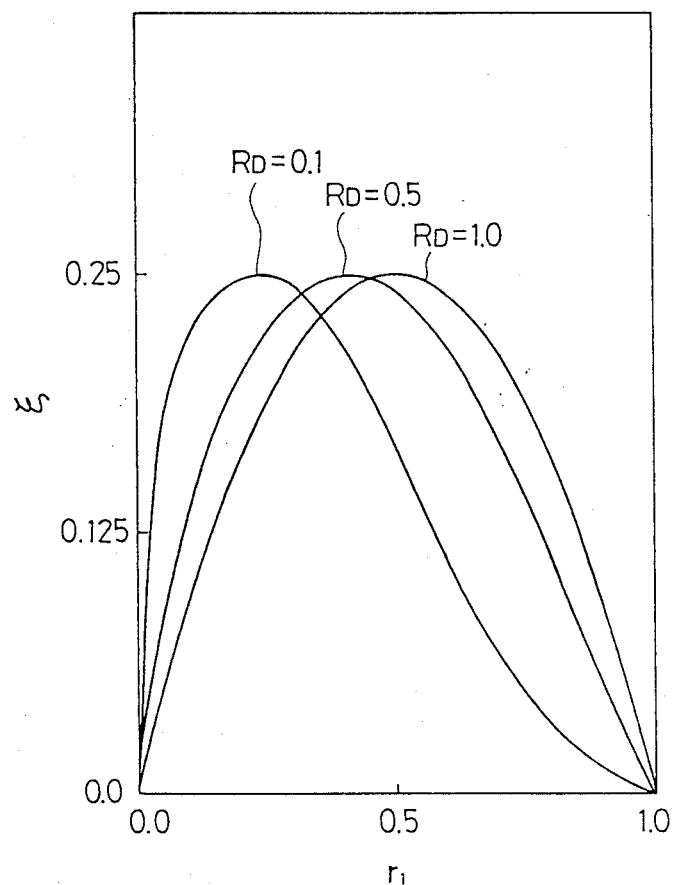
FIG. 16 is a graph of a dimensionless parameter $\xi$ appearing in analysis of the reduction of acoustic noise achieved by the sandwich structure, as functions of two other parameters $R_0$ and $r_1$ appearing in the same analysis for explaining the preferable conditions for the sandwich structure.

Now, the Eq.(20) gives the condition for obtaining larger total loss factor $\eta$ as having larger loss factor $\beta$ of the viscoelastic layer, having smaller shear modulus $G_0$, and having larger value for the dimensional parameter $\xi$. But, as can be seen from the Eq.(22), the dimensional parameter $\xi$ is determined by $R_D$ and $r_1$. The relationships of the dimensionless parameter $\xi$ with respect to $R_D$ and $r_1$ are shown in FIG. 16, which indicates that when $R_D = 1$ in which the stiffness of the structure member and the constraining layer is the same the dimensional parameter $\xi$ is largest ar $r_1 = 0.5$, i.e., when the viscoelastic layer is at the middle of the sandwich structure. In such a case, the total loss factor $\eta$ also becomes large. Furthermore, for $r_1$ different from 0.5 in which there is a large difference between the flexural rigidity of the structure member and that of the con-straining layer, both the dimensional parameter $\xi$ as well as the total loss factor $\eta$ become small. Similar results are obtained for $R_D$ different from 1.0 as well. Thus, in order to have a large total loss factor $\eta$ and a good damping characteristic together, the flexural rigidities of the structure member and the constraining layer are preferably as close to each other as possible. Also it can be seen from FIG. 16 that, the dimensionless parameter $\xi$ not less than 0.1 is desirable.

Summarizing the above analysis, using for the viscoelastic layer 9 a material with large loss factor $\beta$, having small Young's modulus and large Poisson ratio $\nu_0$ for which the shear modulus $G_0 = E_0/2(2+\nu_0)$ becomes small, and making the flexural rigidities of the resin members sandwiching the viscoelastic layer 9 to be as close to each other as possible, large total loss factor $\eta$ can be obtained with satisfactory damping characteristic.

On the other hand, the thickness of the viscoelastic layer 9 is preferably thinner for the sake of larger shear strain, whereas it is preferably thicker for the sake of increasing the volume from which the energy can dissipate. In a practical nuclear magnetic resonance imaging apparatus, an appropriate value for the thickness of the viscoelastic layer is therefore within a range between 0.01 mm and 3 mm.

Figure 17:
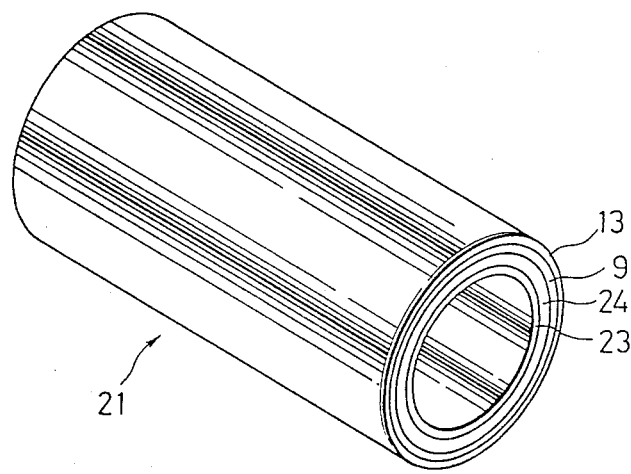
FIG. 17 is a perspective view of a main portion of the second embodiment of a nuclear magnetic resonance imaging apparatus according to the present invention.
Figure 18:
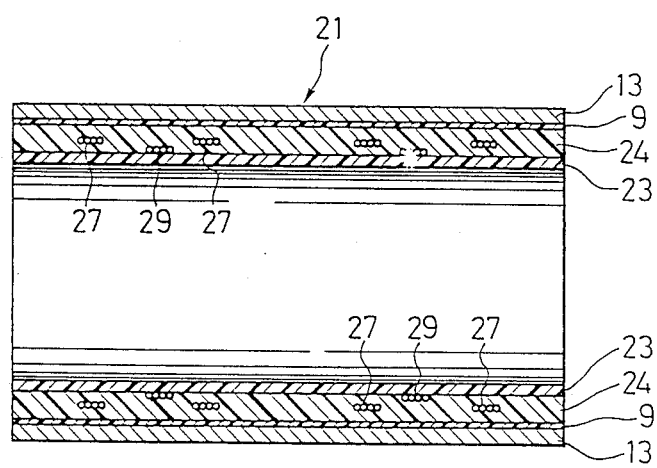
FIG. 18 is a cross sectional view of a main portion of the nuclear magnetic resonance imaging apparatus of FIG. 17.

Referring now to FIGS. 17 and 18, there is shown a second embodiment of a nuclear magnetic resonance imaging apparatus according to the present invention.

In this second embodiment, the gradient coil 21 is formed with a coil core 23 made of G-FRP (Glass-Fiber reinforced plastics) around which coils 27 and 29 are wound, an epoxy resin 24 which molds the coils 27 and 29, the viscoelastic layer 9 over the epoxy resin 24, and the outer layer 13 made also of G-FRP over the viscoelastic layer 9. Other feature of this second embodiment is substantially the same as the first embodiment.

The reason for providing the outer layer 13 made of G-FRP will now be explained.

First, it is to be noted that the Young's modulus for the epoxy resin is 250 kgf/mm$^2$, whereas that of the G-FRP is 1300 to 3200 kgf/mm$^2$, so that the G-FRP has a larger stiffness.

As mentioned above, in order to have a large total loss factor $\eta$, it is necessary to make the flexural rigidities of the resin members sandwiching the viscoelastic layer 9 to be as close to each other as possible.

However, in such a configuration surrounding the viscoelastic layer 9 with the epoxy resin makes the flexural rigidity decreasing towards an outer edge, so that it becomes difficult to obtain a satisfactory total loss factor $\eta$.

On the other hand, although by using the same epoxy resin for inner side as well as outer side can make the flexural rigidities of the sandwiching resin member nearly equal, this also makes the gradient coil 21 thicker so that either the main magnet bore need to be enlarged or else the measurement space need to be narrowed, neither of which is desirable from a point of view of designing.

Thus, in the second embodiment, G-FRP which has a much larger stiffness are provided around the coil core 23 with relatively thinner thickness, so as to make the flexural rigidities of the resin members sandwiching the viscoelastic layer 9 to be as close to each other as possible.

In order to verify the effect of this second embodiment, the following second experiment had been conducted by the present inventor.

In this second experiment, a nuclear magnetic resonance imaging apparatus used is basically the same as that used in the first experiment shown in FIG. 11, except that the characteristic feature of the second embodiment shown in FIGS. 17 and 18 is incorporated.

Figure 19:
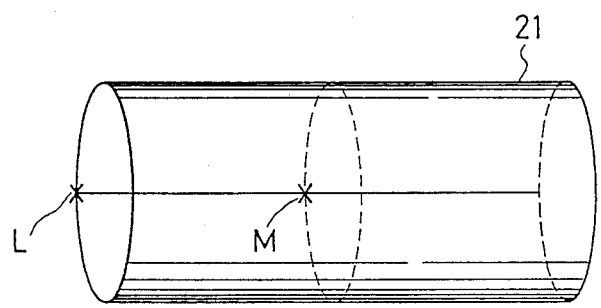
FIG. 19 is a diagrammatic illustration of an inner shell of the nuclear magnetic resonance imaging apparatus of FIG. 17 for explaining positions where the measurements of the acceleration had been taken in the second experiment.

As shown in FIG. 19, in this second experiment, two acceleration pickups are separately attached to the gradient coil 21 at an edge of the measurement space down by a point L and at a middle in the direction of the central axis of the measurement space shown by a point M.

Figure 20:
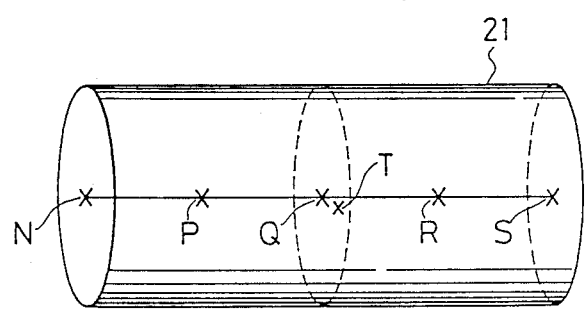
FIG. 20 is another diagrammatic illustration of an inner shell of the nuclear magnetic resonance imaging apparatus of FIG. 17 for explaining positions where the measurement of the acoustic noise had been taken in the experiment.

Furthermore, as shown in FIG. 20, the microphones are placed at points N, P, Q, R, and S on the central axis of the measurement space as well as at a point T near a wall surrounding the measurement space, off the central axis at the middle in the direction of the central axis, so as to investigate the relationship between the vibration and the acoustic noise.

Figure 21:
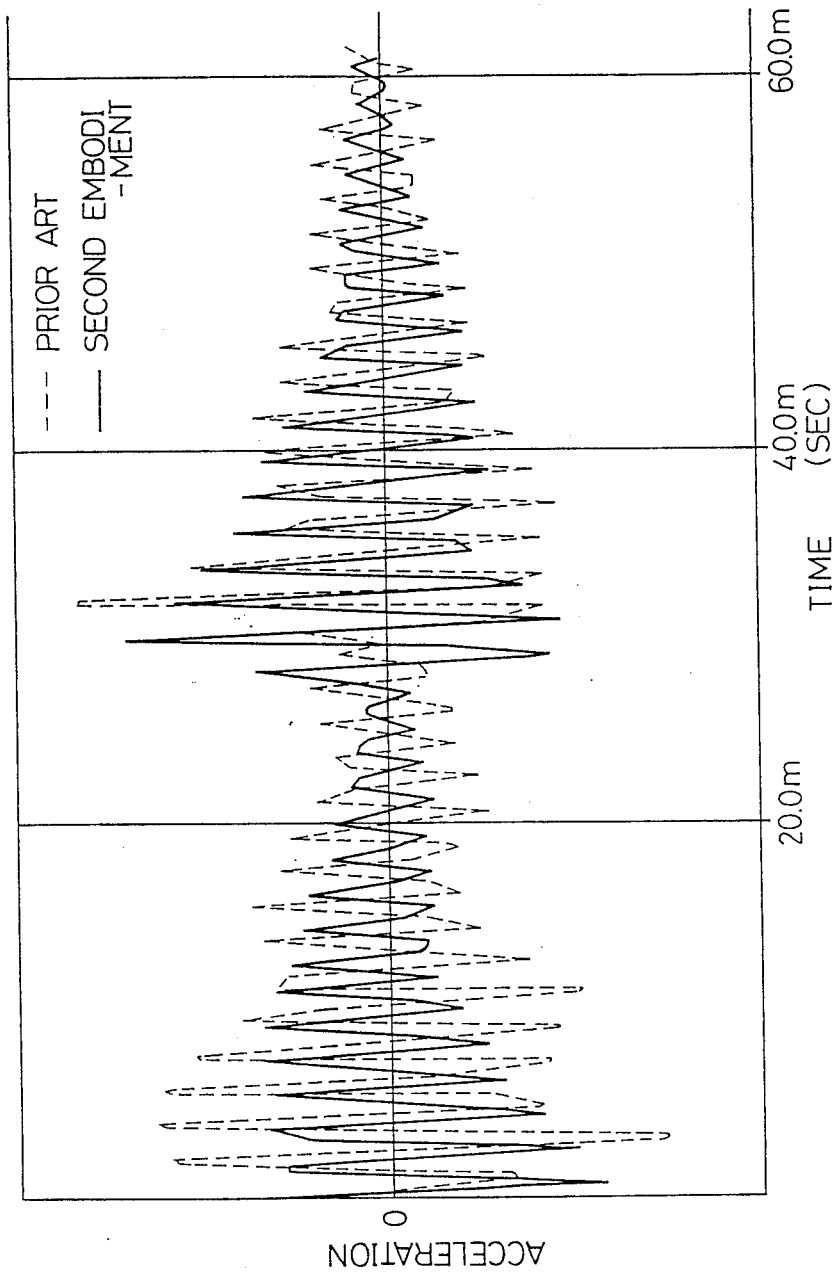
FIG. 21 is a graph of the acceleration as a function of time measured at one location inside the measurement space in the second experiment.
Figure 22:
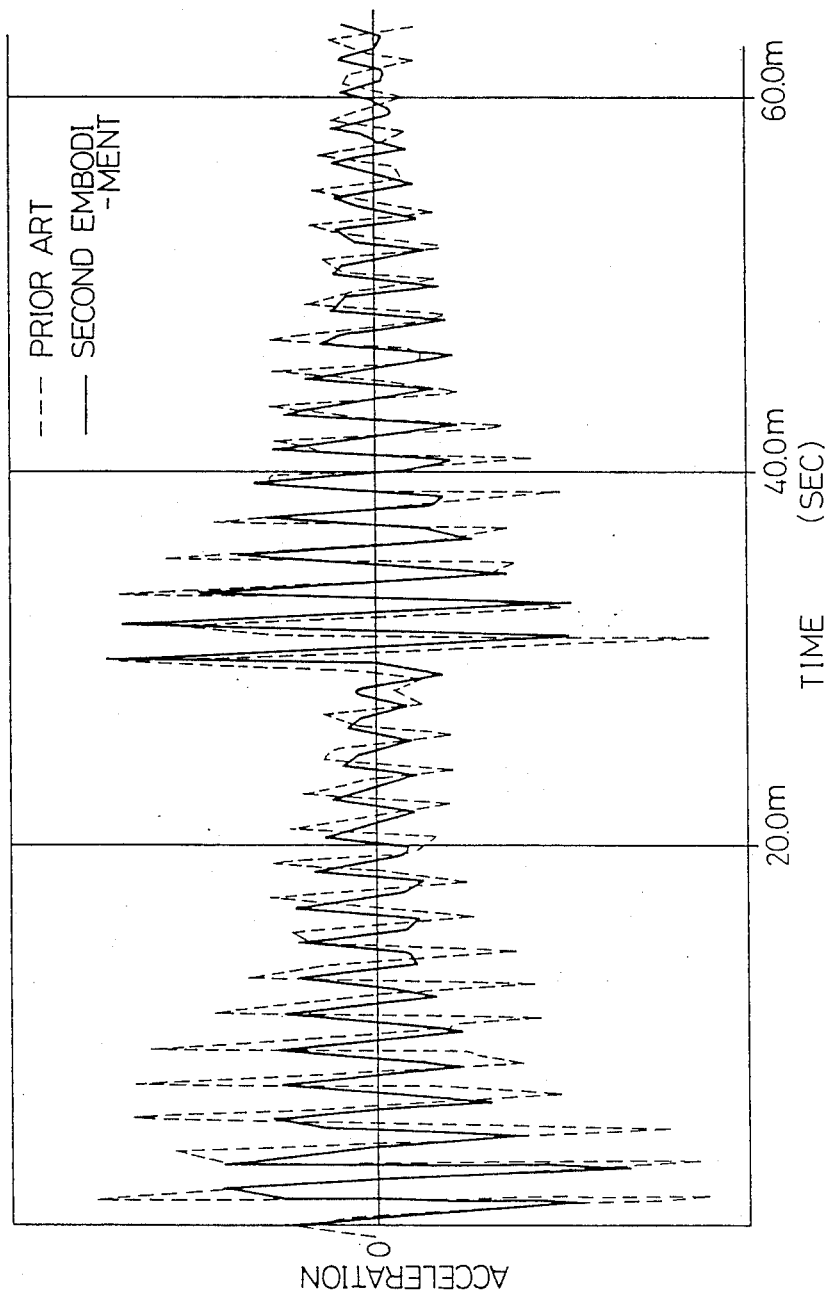
FIG. 22 is another graph of the acceleration as a function of time measured at another location inside the measurement space in the second experiment.

The measured acceleration at the points L and M as functions of time are shown in FIGS. 21 and 22, respectively, in which the results obtained by the nuclear magnetic resonance imaging apparatus according to the second embodiment (with the viscoelastic layer 9 surrounded by the G-FRP outer shell) which are represented by solid curves are contrasted against those obtained by the conventional nuclear magnetic resonance imaging apparatus of similar type (without the viscoelastic layer 9 and the G-FRP outer shell) which are represented by dashed curves. It is clearly shown in FIGS. 21 and 22 that the substantial reduction of the vibration is possible in the nuclear magnetic resonance imaging apparatus of the second embodiment, at the both points L and M, compared with the conventional nuclear magnetic resonance imaging apparatus.

Figure 23:
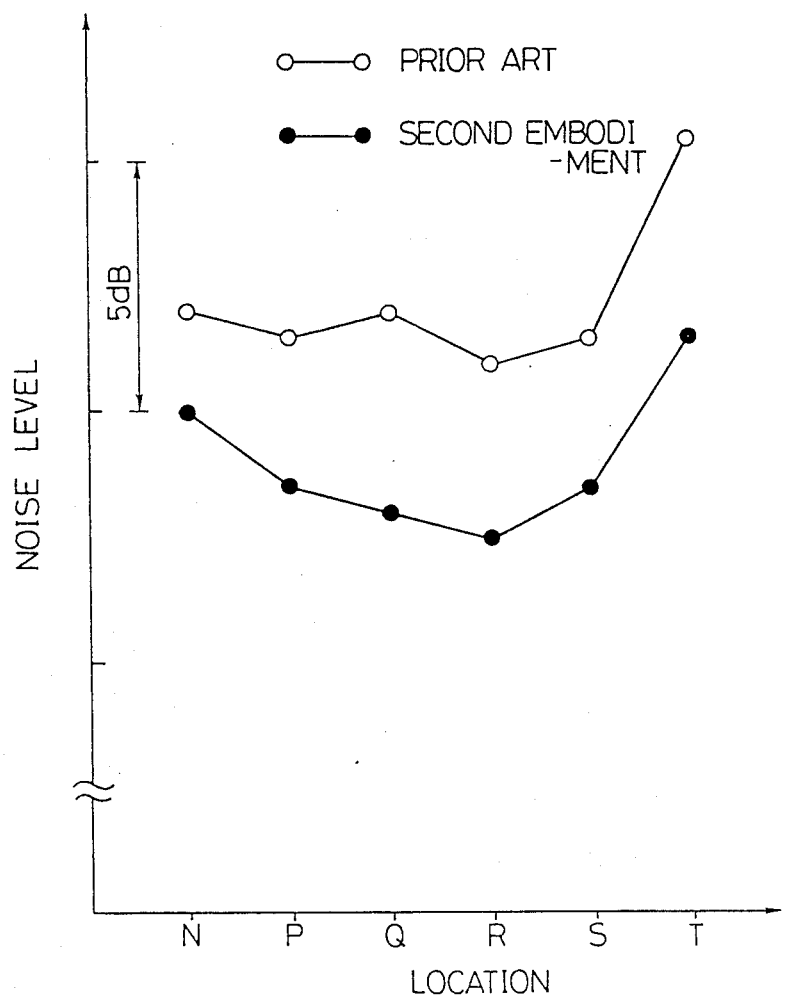
FIG. 23 is a graph of acoustic noise level measured at various location inside the measurement space in the second experiment.

Also, the measured acoustic noise levels at the points N, P, Q, R, S, and T are shown in FIG. 23, in which the results obtained by the nuclear magnetic resonance imaging apparatus according to the second embodiment (with the viscoelastic layer 9 surrounded by the G-FRP outer shell) which are represented by solid dots are contrasted against those obtained by the conventional nuclear magnetic resonance imaging apparatus of similar type (without the viscoelastic layer 9 and the G-FRP outer shell) which are represented by blank dots. It is clearly shown in FIG. 23 that the substantial reduction of the acoustic noise is also possible in the nuclear magnetic resonance imaging apparatus of the second embodiment compared with the conventional nuclear magnetic resonance imaging apparatus, by an average of approximately 3.25 dB, although the results slightly varies at different location.

Thus, the effectiveness of sandwich structure around the viscoelastic layer 9 in reducing the vibration of the gradient coil 21 as well as the acoustic noise in the measurement space had been vindicated once again, and the additional feature of G-FRP outer shell in the second embodiment had been shown to be effective in further reduction of the vibration and the acoustic noise.

Figure 24:
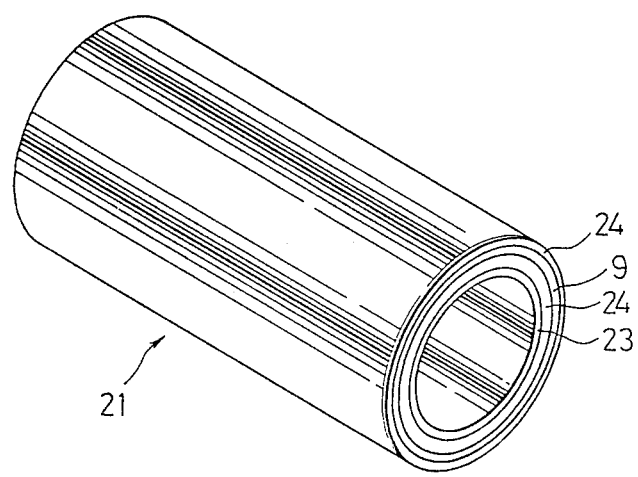
FIG. 24 is a perspective view of a main portion of the third embodiment of a nuclear magnetic resonance imaging apparatus according to the present invention.
Figure 25:
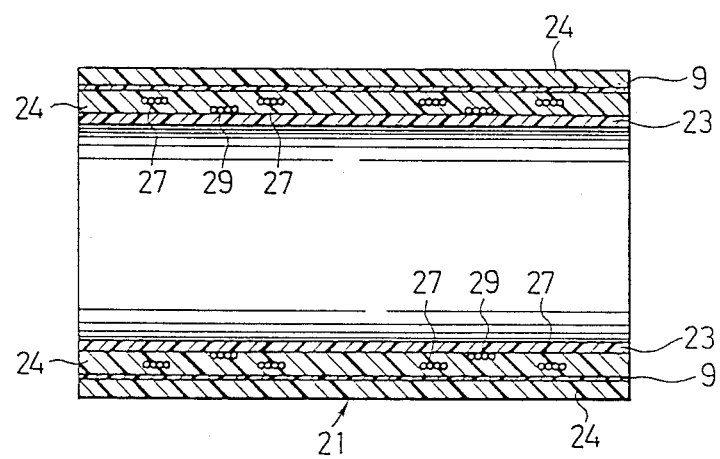
FIG. 25 is a cross sectional view of a main portion of the nuclear magnetic resonance imaging apparatus of FIG. 24.

Referring now to FIGS. 24 and 25, there is shown a third embodiment of a nuclear magnetic resonance imaging apparatus according to the present invention.

In this third embodiment, the viscoelastic layer 9 is formed inside the epoxy resin 24 molding the coils 27 and 29. Such a formation of the viscoelastic layer 9 can be accomplished by the manner similar to that suggested in the explanation of the first embodiment for forming the viscoelastic layer 9 inside the inner shell 7.

In this configuration of the third embodiment, the viscoelastic layer 9 also functions to dissipate the vibration energy and to reduce the vibration of the gradient coil 21, so that the similar result concerning the reduction of the acoustic noise can be obtained. Moreover, since the Eqs.(6), (7), (8), (20), and (22) given above for the first embodiment also hold for this third embodiment, the same criteria that the vibration of the epoxy resin 24 can be reduced by making the energy dissipation D larger using the thin viscoelastic layer 9 of smaller Young's modulus also applies for this third embodiment.

Similarly, the other embodiments are conceivable in which the location of the viscoelastic layer 9 is changed without altering the effect of the viscoelastic layer 9.

Figure 26:
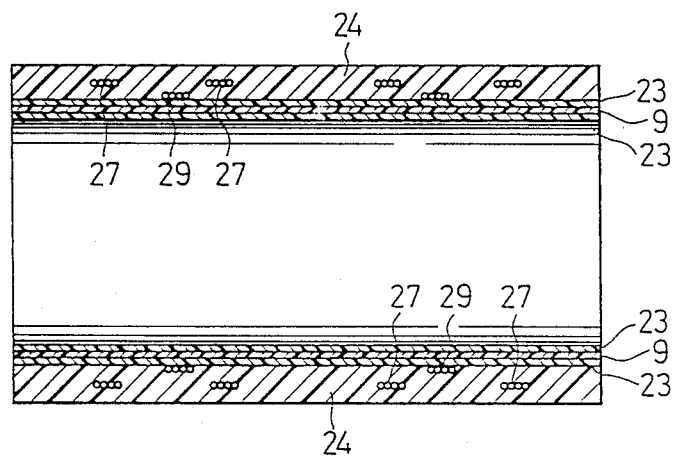
FIG. 26 is a cross sectional view of a main portion of the fourth embodiment of a nuclear magnetic resonance imaging apparatus according to the present invention.

Thus, FIG. 26 shows a fourth embodiment of a nuclear magnetic resonance imaging apparatus according to the present invention, in which the viscoelastic layer 9 is formed inside the coil core 23 of the gradient coil 21.

Figure 27:
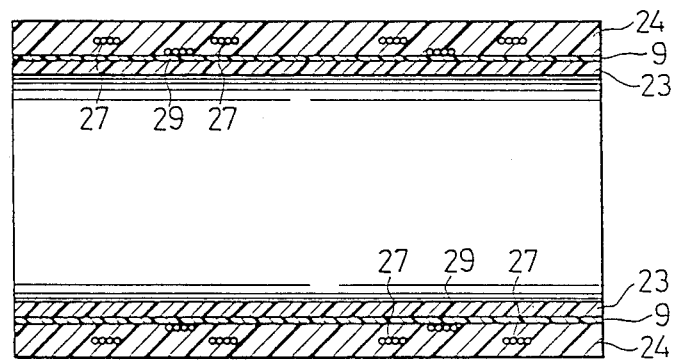
FIG. 27 is a cross sectional view of a main portion of the fifth embodiment of a nuclear magnetic resonance imaging apparatus according to the present invention.

Likewise, FIG. 27 shows a fifth embodiment of a nuclear magnetic resonance imaging apparatus according to the present invention, in which the viscoelastic layer 9 is formed between the coil core 23 of the gradient coil 21 and the resin 24 molding the coils 27 and 29.

Figure 28:
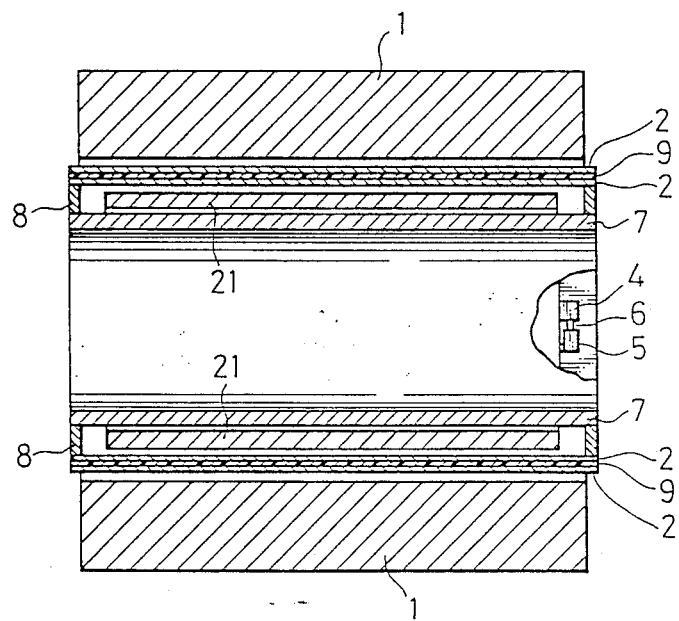
FIG. 28 is a cross sectional view of a main portion of the sixth embodiment of a nuclear magnetic resonance imaging apparatus according to the present invention.

Also, FIG. 28 shows a sixth embodiment of a nuclear magnetic resonance imaging apparatus according to the present invention, in which the viscoelastic layer 9 is formed inside the outer shell 2 which supports the gradient coil 21 against the main magnet 1.

Further variations can be obtained as the combination of the above embodiments, such as one in which the outer layer 13 made of G-FRP of the second embodiment is incorporated to any one of the third, fourth fifth, or sixth embodiment above.

It is also to be noted that although in all of the embodiments described above, the viscoelastic layer 9 has been described as a single layer, this may be modified to multi-layer configurations.

Furthermore, although in all of the embodiment described above, the viscoelastic layer 9 has been formed in cylindrical shape along the cylindrical shells, partial or fragmental use of the feature of the present invention may also be effective.

In addition, although in all of the embodiments described above, the sandwich structure around the viscoelastic layer 9 has been provided by other components of the nuclear magnetic resonance imaging apparatus which are necessary regardless of the presence of the viscoelastic layer 9, this sandwich structure may be formed by providing additional resin members exclusively for this purpose.

It is also obvious that although the embodiments has been described for a particular model of a nuclear magnetic resonance imaging apparatus, the features of the present invention can be incorporated just as effectively and beneficially in other models of nuclear magnetic resonance imaging apparatuses.

Besides these, many modifications and variations of these embodiments may be made without departing from the novel and advantageous features of the present invention. Accordingly, all such modifications and variations are intended to be included within the scope of the appended claims.

What is claimed is:

1. A nuclear magnetic resonance imaging apparatus, comprising:
   a main magnet for generating a static magnetic field in a measurement space in which a body to be examined is to be placed;
   gradient coil means for producing gradient magnetic fields over the static magnetic field;
   means for detecting signals from the body in the static and gradient magnetic fields due to a nuclear magnetic resonance phenomenon;
   means for processing the detected signals so as to obtain tomographic images of the body at arbitrary cross sections; and
   a sandwich structure which is located between the body and the main magnet, comprising a viscoelastic layer sandwiched by a first and a second sandwiching members.

2. The apparatus of claim 1, wherein the snadwich structure is arranged in a vicinity of the gradient coil means while making one of a direct and an indirect contact with the gradient coil means.

3. The apparatus of claim 1, wherein the detecting means comprises transmitter and receiver coil means, and wherein the sandwich structure is arranged in a vicinity of the detecting means.

4. The apparatus of claim 1, wherein at least one of the first and second members of the sandwich structure is located within the measurement space, and comprises a hollow member which serves as a coil core for the detecting means.

5. The apparatus of claim 1, wherein at least one of the first and second members of the sandwich structure comprises a coil core for the gradient coil means.

6. The apparatus of claim 1, wherein the gradient coil means comprises coils wound around a coil core and a resin molding the coils which also serves as at least one of the first and second sandwiching members of the sandwich structure.

7. The apparatus of claim 1, wherein the gradient coil means comprises coils wound around a coil core, a first resin molding the coils, and a second resin having a larger stiffness than the first resin, the second resin surrounding the first resin, the second resin being also serving as at least one of the first and second sandwiching members of the sandwich structure.

8. The apparatus of claim 1, wherein the gradient coil means is supported to the main magnet by a hollow member which also serves as at least one of the first and second sandwiching members of the sandwich structure.

9. The apparatus of claim 1, wherein the Young's modulus of the viscoelastic layer is smaller than that of the first sandwiching member as well as that of the second sandwiching member.

10. The apparatus of claim 1, wherein the loss factor of the viscoelastic layer is larger than that of the first sandwiching member as well as that of the second sandwiching member.

11. The apparatus of claim 1, wherein the shear modulus of the viscoelastic layer is smaller than that of the first sandwiching member as well as that of the second sandwiching member.

12. The apparatus of claim 1, wherein the flexural rigidities of the first and second sandwiching members are substantially equal to each other.

13. The apparatus of claim 1, wherein the thickness of the viscoelastic layer is thinner than that of the first and second sandwiching members together.

14. The apparatus of claim 1, wherein the thickness of the viscoelastic layer is within a range between 0.01 mm and 3.0 mm.

15. The apparatus of claim 1, wherein the viscoelastic layer is made of polymer compound.

16. The apparatus of claim 1, wherein the viscoelastic layer is formed by pouring in a liquid viscoelastic material into a space between the first and second sandwiching members.

17. The apparatus of claim 1, wherein the sandwich structure is such that a dimensional parameter given by:

$$\xi = \frac{3r_2(r_1 - r_1^2)}{[R_D + (1/R_D) - 2]r_1^4 + 4(1 - R_D)r_1^3 - 6(1 - R_D)r_1^2 + 4(1 - R_D)r_1 + R_D}$$

where $r_1 = h_1/(h_1 + h_2 + h_3)$, $r_2 = h_2/(h_1 + h_2 + h_3)$, $h_1$ is a thickness of the first sandwiching member, $h_2$ is a thickness of the viscoelastic layer, $h_3$ is a thickness of the second sandwiching member, and $R_D$ is a ratio of stiffness of the first and second sandwiching members, satisfies an inequality:

$$\xi \geq 0.1$$

18. The apparatus of claim 1, wherein one of the first and second sandwiching members is made of a material with larger stiffness than other one, which is also thinner in thickness than another one.

19. The apparatus of claim 18, wherein one of the first and second sandwiching members with larger stiffness is made of G-FRP (Glass-Fiber reinforced plastics) while another one is made of a resin.

20. The apparatus of claim 18, wherein one of the first and second sandwiching members with larger stiffness is located further away from the measurement space than another one.

21. A nuclear magnetic resonance imaging apparatus, comprising:
   a main magnet for generating a static magnetic field in a measurement space in which a body to be examined is to be placed;
   gradient coil means for producing gradient magnetic fields over the static magnetic field;
   means for detecting signals from the body in the static and gradient magnetic fields due to a nuclear magnetic resonance phenomenon;
   means for processing the detected signals so as to obtain tomographic images of the body at arbitrary cross sections; and
   a hollow member which is located between the measurement space and the main magnet, including a viscoelastic layer.

22. A nuclear magnetic resonance imaging apparatus, comprising:
- a main magnet for generating a static magnetic field in a measurement space in which a body to be examined is to be placed;
- gradient coil means for producing gradient magnetic fields over the static magnetic field, the gradient coil means being comprised of coils wound around a coil core, a first resin molding the coils, and a second resin having a larger stiffness than the first resin, the second resin surrounding the first resin, at least one of inside the second resin and between the first resin and seconds resin containing a viscoelastic layer;
- means for detecting signals from the body in the static and gradient magnetic fields due to a nuclear magnetic resonance phenomenon; and means for processing the detected signals so as to obtain tomographic images of the body at arbitrary cross sections.

23. A nuclear magnetic resonance imaging apparatus, comprising:
- a main magnet for generating a static magnetic field in a measurement space in which a body to be examined is to be placed;
- gradient coil means for producing gradient magnetic fields over the static magnetic field, comprising a coil core which contains a viscoelastic layer, and coils wound around the coil core;
- means for detecting signals from the body in the static and gradient magnetic fields due to a nuclear magnetic resonance phenomenon; and
- means for processing the detected signals so as to obtain tomographic images of the body at arbitrary cross sections.

24. A nuclear magnetic resonance imaging apparatus, comprising:
- a main magnet for generating a static magnetic field in a measurement space in which a body to be examined is to be placed;
- gradient coil means for producing gradient magnetic fields over the static magnetic field, comprising a coil core, coils wound around the coil core, and a resin molding the coils, at least one of inside the resin and between the coil core and resin containing a viscoelastic layer;
- means for detecting signals from the body in the static and gradient magnetic fields due to a nuclear magnetic resonance phenomenon; and
- means for processing the detected signals so as to obtain tomographic images of the body at arbitrary cross sections.

25. A nuclear magnetic resonance imaging apparatus, comprising:
- a main magnet for generating a static magnetic field in a measurement space in which a body to be examined is to be placed;
- gradient coil means for producing gradient magnetic fields over the static magnetic field;
- means for detecting signals from the body in the static and gradient magnetic fields due to a nuclear magnetic resonance phenomenon;
- means for processing the detected signals so as to obtain tomographic images of the body at arbitrary cross sections; and
- a hollow member which supports the gradient coil means against the main magnet, and is located between the measurement space and the main magnet, including a viscoelastic layer.

* * * * *